United States Patent

Byrn et al.

[11] Patent Number: 6,011,412
[45] Date of Patent: Jan. 4, 2000

[54] FREQUENCY SHIFT DETECTION CIRCUIT WITH SELECTABLE GRANULARITY

[75] Inventors: Jonathan William Byrn, Kasson; Chad B. McBride; Brian Andrew Schuelke, both of Rochester, all of Minn.

[73] Assignee: International Business Machines Corporation, Armonk, N.Y.

[21] Appl. No.: 09/070,925

[22] Filed: May 1, 1998

[51] Int. Cl.[7] .................................................. H03D 13/00
[52] U.S. Cl. ...................................... 327/12; 327/3; 327/7
[58] Field of Search ............................... 327/2, 3, 7, 10, 327/12, 63, 64, 166, 261, 263, 269, 271, 276, 277

[56] References Cited

U.S. PATENT DOCUMENTS

| | | | |
|---|---|---|---|
| 3,956,710 | 5/1976 | Seitz et al. | 331/1 A |
| 4,236,114 | 11/1980 | Sasaki | 327/176 |
| 4,287,480 | 9/1981 | Swift et al. | 331/1 A |
| 4,617,520 | 10/1986 | Levine | 328/133 |
| 4,929,916 | 5/1990 | Fukuda | 331/1 A |
| 5,008,635 | 4/1991 | Hanke et al. | 331/1 A |
| 5,126,690 | 6/1992 | Bui et al. | 331/1 A |
| 5,278,520 | 1/1994 | Parker et al. | 331/1 A |
| 5,619,148 | 4/1997 | Guo | 327/3 |

*Primary Examiner*—Timothy P. Callahan
*Assistant Examiner*—An T. Luu
*Attorney, Agent, or Firm*—Lawrence D. Maxwell

[57] ABSTRACT

A frequency shift detection circuit for detecting a frequency shift between a first signal and a second signal includes two or more delay circuits coupled to one another in series and two or more comparison logic circuits. The first delay circuit in the series receives one of the first and second signals and produces a delayed replica. Each of the other delay circuits receives the delayed replica produced by the previous delay circuit in the series and produces a further delayed replica. Thus, the signal produced by each delay circuit is delayed from the original signal by a different amount. Each comparison logic circuit receives one of the delayed replicas and receives the other one of the first and second signals, i.e., the one that is not received by the delay circuits. In response, the comparison logic circuit produces a frequency shift detection signal when it detects a phase difference between that other one of said first and second signals and the delayed replica. By selecting or tapping one of the outputs of the comparison logic circuits, a user can select the detection granularity.

17 Claims, 6 Drawing Sheets

FREQUENCY SHIFT DETECTION CIRCUIT WITH SELECTABLE GRANULARITY

BACKGROUND OF THE INVENTION

1. Field of the Invention

The present invention relates generally to circuits for detecting relative frequency shifts between two signals and, more specifically, to out-of-lock detection circuits for phase-locked loops.

2. Description of the Related Art

A phase-locked loop (PLL) is a circuit that includes a phase detector, a filter and a voltage-controlled oscillator (VCO). The phase detector receives a reference signal and a feedback signal and produces a phase-error signal representing the phase difference between the reference and feedback signals. The filter receives the phase-error signal and provides a filtered signal to the VCO. The VCO produces the feedback signal in response to the filtered phase-error signal. The VCO quickly "locks" or maintains the feedback signal in a fixed phase relationship with the reference signal. If the reference frequency changes, the PLL briefly goes out of lock before regaining lock. A PLL is a versatile circuit that may be used in frequency multipliers, digital data communication circuits, and myriad other circuits.

It is desirable to detect when a PLL goes out of lock, and out-of-lock detection circuits have been developed. A typical out-of-lock detection circuit monitors the reference and feedback signals, and produces a signal indicating an out-of-lock condition when it detects a frequency difference between them. Such out-of-lock detection circuits typically monitor the reference and feedback signals over an interval of a number of cycles of the reference signal before providing an indication that the PLL is out of lock. It would be desirable to provide a faster out-of-lock detector that detects an out-of-lock condition more quickly than prior detectors.

In some circuits a conventional out-of-lock detector may be useless because deviations in the reference frequency or feedback frequency are expected in normal operation. For example, in a spread spectrum communications circuit the reference signal can normally be expected to continuously change frequency over the selected frequency spectrum. The circuit may operate properly, i.e., perform the function intended by the circuit designer, yet trigger a conventional out-of-lock detector. Similarly, in some circuits a certain amount of jitter can be tolerated without detrimentally affecting operation of the circuit. It would be desirable to provide an out-of-lock detector that generates an out-of-lock indication only in response to relatively large frequency deviations and does not generate an out-of-lock indication in response to deviations that can be expected to occur in normal operation. These problems and deficiencies are satisfied by the present invention in the manner described below.

SUMMARY OF THE INVENTION

The present invention relates to a frequency shift detection circuit and method for detecting a frequency shift between a first signal and a second signal. The first and second signals may be the reference signal and feedback signal of a phase-locked loop circuit or may be any other suitable signals. The circuit includes two or more delay circuits coupled to one another in series and two or more comparison logic circuits. The first delay circuit in the series receives one of the first and second signals and produces a delayed replica. Each of the other delay circuits receives the delayed replica produced by the previous delay circuit in the series and produces a further delayed replica. Thus, the signal produced by each delay circuit is delayed from the original signal by a different amount. Each comparison logic circuit receives one of the delayed replicas and receives the other one of the first and second signals, i.e., the one that is not received by the delay circuits. In response, the comparison logic circuit produces a frequency shift detection signal when it detects a phase difference between that other one of said first and second signals and the delayed replica.

The delay circuits and corresponding comparison logic circuits provide a selectable granularity. Because the amount by which each replica is delayed is different, each comparison logic circuit is sensitive to a different amount of phase difference. The comparison logic circuits at the beginning of the series, where the total delay is lower, are more sensitive to frequency shift between the two signals than the comparison logic circuits further down the chain, where the total delay is greater. Although each comparison logic circuit produces a frequency shift detection signal, one of them may be selected to provide a detection sensitivity that the user deems suitable. For example, the user may include the circuit of the present invention in a circuit in which a certain amount of jitter is tolerable, and the user may therefore select one of the frequency shift detection signals that only indicates detection of a frequency shift when the frequency shift exceeds the tolerable jitter level.

In an exemplary embodiment of the invention, each comparison logic circuit includes a suitable edge-triggered storage element such as flip-flop. Nevertheless, other means for comparing two signals to determine their phase relationship may be suitable. A D-type flip-flop may be used for this function in the following manner. One of the delayed replicas of the first or second signal may be provided to the D input of a flip-flop, and the other of the first and second signals may be provided to the clock input of the flip-flop. Alternatively, or, as explained below, in addition, one of the delayed replicas of the first or second signal may be provided to the clock input of a flip-flop, and the other of the first and second signals may be provided to the D input of the flip-flop. If the signals have not drifted in frequency with respect to one another, the flip-flop will consistently latch the same value in response to each rising edge of the signal at the clock input because its phase relationship to the signal at the D input is constant and determined by the delay amount. If one of the signals drifts in frequency, however, such that the signal at the D input has changed in value at the time of the rising edge of the signal at the clock input, the flip-flop latches this changed value. The change in the output of the flip-flop indicates detection of the frequency shift.

In the exemplary embodiment, the delay circuits include two or more first delay circuits coupled to one another in series, two or more corresponding second delay circuits coupled to one another in series, two or more first comparison logic circuits, and two or more second comparison logic circuits. The first delay circuits and comparison logic circuits detect positive phase differences between the second signal and the delayed replicas of the first signal. The second delay circuits and comparison logic circuits detect negative phase differences between the second signal and the delayed replicas of the first signal. The terms "positive" and "negative" are used only for convenience to indicate that frequency shifts in both directions, i.e., the first signal speeding up relative to the second signal, or the second signal speeding up relative to the first signal, can be detected, and are not intended to refer to any directions or polarities in absolute terms.

The result produced by the exemplary embodiment can thus include an indication of whether the first signal is speeding up relative to the second signal or vice versa. By further including a logic element that produces the logical OR of the outputs of the first and second comparison logic circuits, the result produced can include an indication of whether the frequency of either signal is changing relative to the other.

Selectable granularity, as described above, is an important advantage of the present invention. Another important advantage of the present invention is that frequency shifts can be detected very rapidly. Unlike conventional phase-locked loop out-of-lock detectors, which do not indicate the out-of-lock condition until a number of cycles of the reference frequency have occurred, the present invention indicates a frequency shift or out-of-lock condition on the next cycle after the shift occurs.

The foregoing, together with other features and advantages of the present invention, will become more apparent when referring to the following specification, claims, and accompanying drawings.

BRIEF DESCRIPTION OF THE DRAWINGS

For a more complete understanding of the present invention, reference is now made to the following detailed description of the embodiments illustrated in the accompanying drawings, wherein.

DESCRIPTION OF PREFERRED EMBODIMENTS

Figure 1:
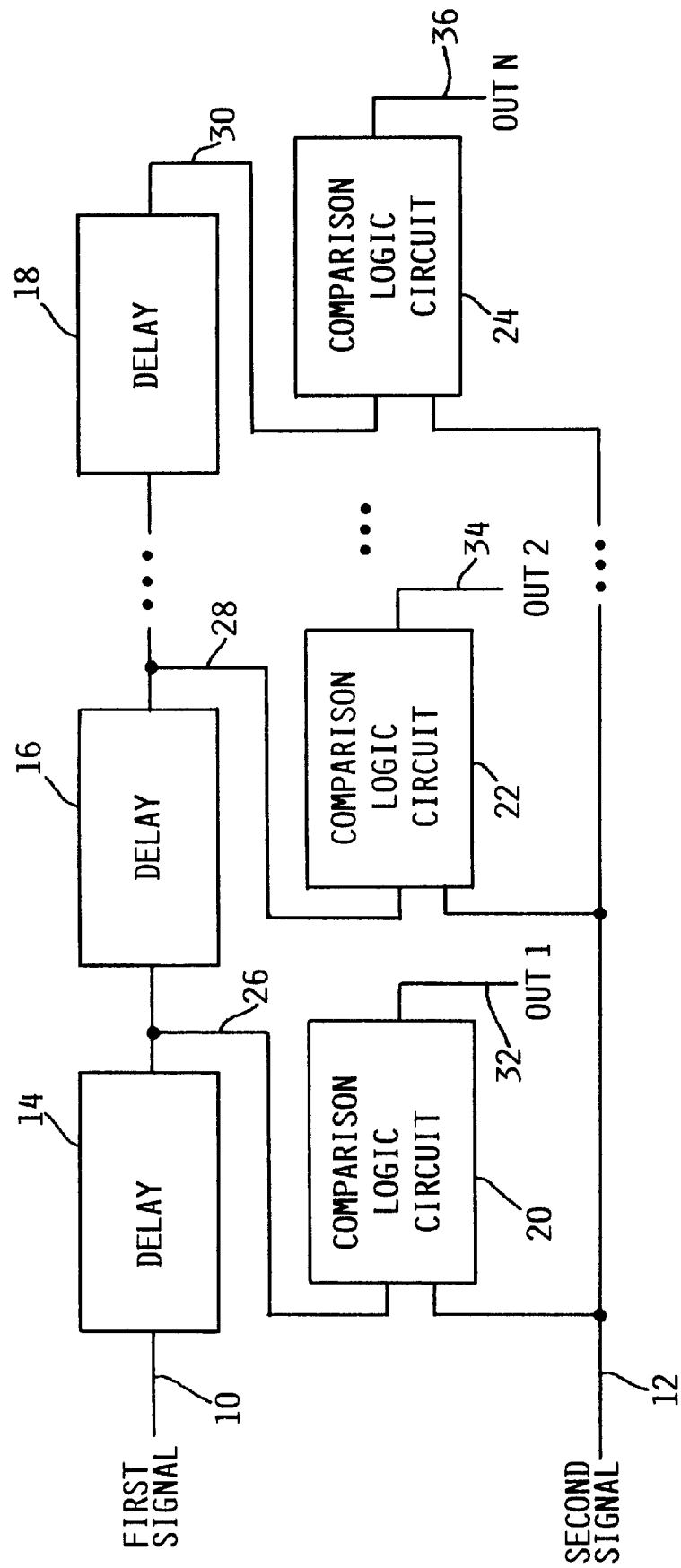
FIG. 1 is a block circuit diagram illustrating a circuit of the present invention that detects a frequency shift between two signals.

As illustrated in FIG. 1, a frequency shift detection circuit receives a first signal at a first input 10 and a second signal at a second input 12. The first and second signals may be the reference signal and feedback signal of a phase-locked loop circuit (not shown). In such a case, the outputs of the circuit would indicate the occurrence of an out-of-lock condition. Nevertheless, the circuit may be used for detecting a shift in frequency between any two suitable signals.

The circuit includes two or more (N) delay circuits 14, 16 and 18 coupled to one another in series, and two or more comparison logic circuits 20, 22 and 24. Each delay circuit and corresponding comparison logic circuit to which it is connected defines a stage of the circuit. Thus, the illustrated circuit includes N stages. The first delay circuit 14 in the series produces a delayed replica at its output 26 in response to the first signal, which it receives at input 10. Similarly, the second delay circuit 16 in the series produces a further delayed replica at its output 28 in response to the delayed replica, which it receives from output 26 of the previous delay circuit 16. Other delay circuits that may be included between delay circuit 16 and delay circuit 18 (as indicated by the ellipses ("...") but not shown for purposes of clarity) are coupled together in series in the same manner. The last delay circuit 18 in the series produces the last delayed replica at its output 30 in response to the delayed replica at the output of the previous delay circuit. Preferably, the time delays provided by delay circuits 14, 16 and 18 are equal to one another.

Each of comparison logic circuits 20, 22 and 24 receives one of the delayed replicas and receives the second signal at input 12. Each of comparison logic circuits 20, 22 and 24 produces a frequency shift detection signal at its output 32, 34 and 36, respectively, that indicates a frequency shift between the first and second signals. Each of comparison logic circuits 20, 22 and 24 produces this frequency shift detection signal when it detects a predetermined phase difference between the first signal and the delayed replica. Each comparison logic circuit 20, 22 and 24 is sensitive to a different minimum phase shift that is determined by the time delay value of its corresponding delay circuit 14, 16 or 18. For example, if each of N delay circuits 14, 16 and 18 provides a time delay of 10 nanoseconds (ns), comparison logic circuit 20 produces a frequency shift detection signal ("OUT1") at its output 32 indicating a frequency shift when first and second signals differ by at least 10 ns; comparison logic circuit 22 produces a frequency shift detection signal ("OUT2") at its output 34 indicating a frequency shift when first and second signals differ by at least 20 ns; and comparison logic circuit 24 produces a frequency shift detection signal ("OUTN") at its output 36 indicating a frequency shift when the first and second signals differ by at least N×10 ns. The greater the number of stages, the higher the granularity of frequency shift detection. The exemplary diagrams of FIGS. 2 and 3 illustrate the above-described operation and the selectable granularity feature.

Figure 2:
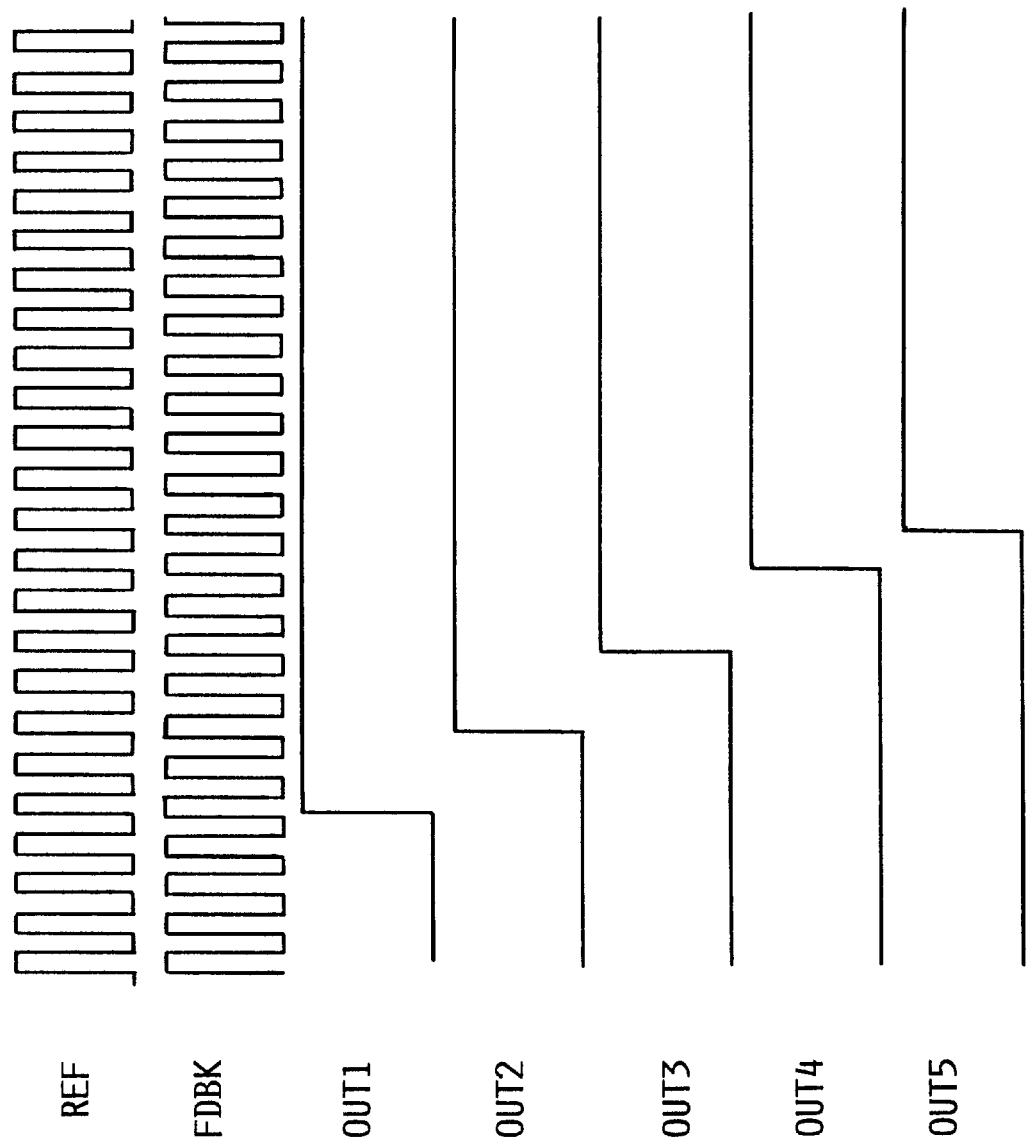
FIG. 2 is a timing diagram illustrating a reference signal drifting in frequency relative to a feedback signal.
Figure 3:
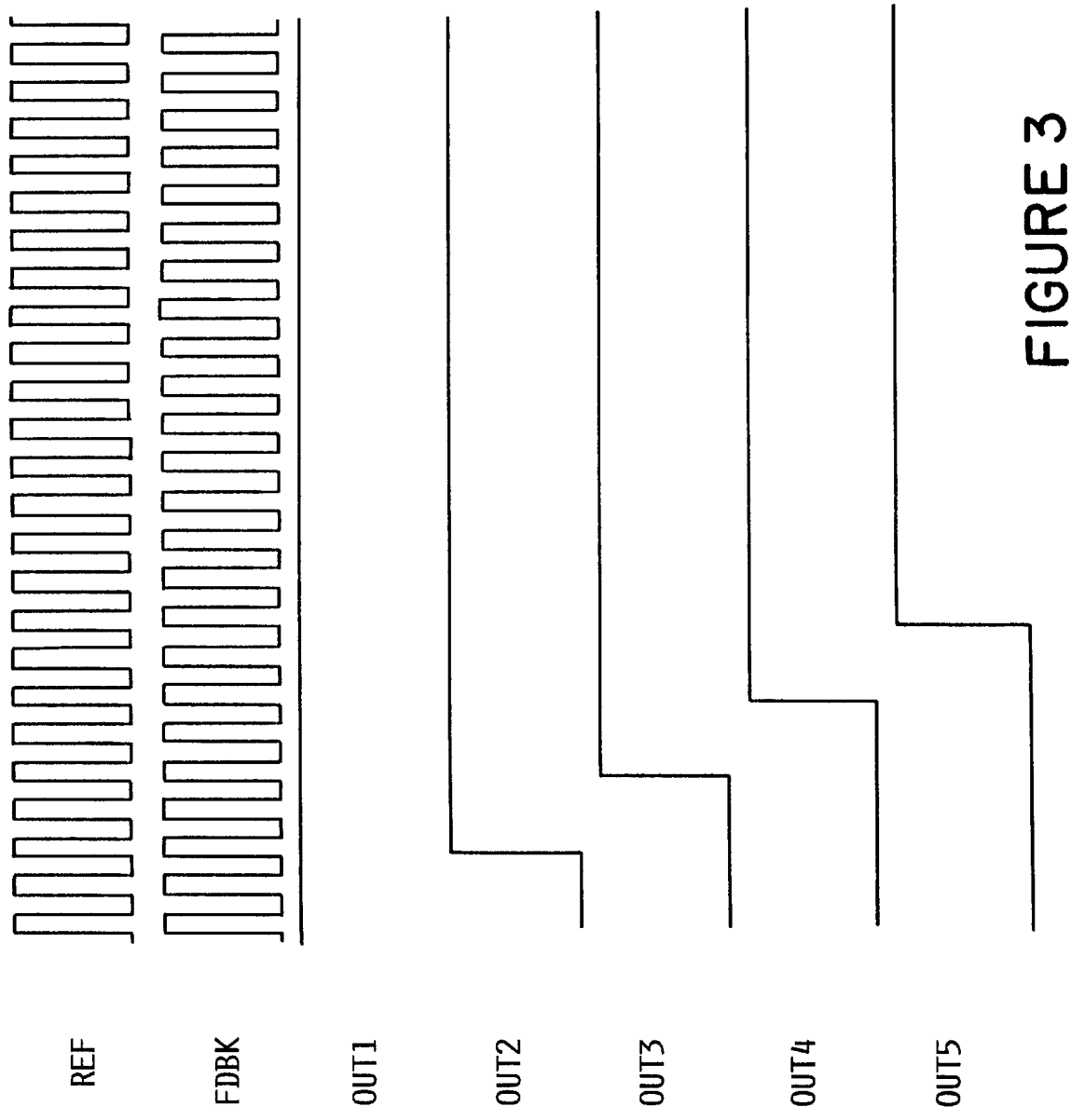
FIG. 3 is a timing diagram illustrating a feedback signal drifting in frequency relative to a reference signal.

FIG. 2 (not to scale) illustrates the timing sequence of an exemplary five-stage (N=5) circuit of the type illustrated in FIG. 1. In the following description, each delay circuit has a delay of T. The first signal, which is received by the delay circuits, is represented by the reference signal ("REF") of a phase-locked loop circuit, and the second signal, which is received by the comparison logic circuits, is represented by the feedback signal ("FDBK") of the phase-locked loop circuit. The feedback signal has a constant frequency. Initially, i.e., at the leftmost end of the timing diagram, the reference signal has the same frequency as the feedback signal. Initially, the output of each stage of the circuit is low or not asserted, indicating, within the limits of the detection sensitivity of that stage, that there is no frequency shift occurring. Shortly thereafter, the reference signal begins to slowly decrease or drift downwardly in frequency. The frequency shift detection signal ("OUT1") provided by the first stage, e.g., comparison logic circuit 20 in FIG. 1, transitions to a high or asserted state first, when the reference signal has drifted at least T ns apart from the feedback signal. Next, as the reference signal drifts in frequency further from the feedback signal, the frequency shift detection signal ("OUT2") provided by the second stage, e.g., comparison logic circuit 22 in FIG. 1, transitions to a high or asserted state when the reference signal has drifted at least 2T ns apart from the feedback signal. Next, the frequency shift detection signal ("OUT3") provided by a third stage transitions to a high or asserted state when the reference signal has drifted at least 3T ns apart from the feedback signal. Similarly, the frequency shift detection signals ("OUT4") provided by a fourth stage and fifth stage ("OUT5") transition in corresponding sequence to a high or asserted state when the reference signal has drifted at least 4T ns and 5T ns, respectively, apart from the feedback signal.

The circuit operates in the same manner whether the first signal drifts relative to a stable second signal or vice versa. FIG. 3 (not to scale) similarly illustrates the timing sequence of an exemplary five-stage (N=5) circuit of the type illustrated in FIG. 1 in which the reference signal ("REF"), which is received by the delay circuits, has a constant frequency, but the feedback signal ("FDBK"), which is received by the comparison logic circuits, is slowly decreasing in frequency. As the feedback signal begins to slowly drift in frequency with respect to the stable reference signal, the frequency shift detection signal ("OUT1") provided by the first stage, e.g., comparison logic circuit 20 in FIG. 1, transitions to a high or asserted state first, when the feedback signal has drifted at least T ns apart from the reference signal. Next, as the feedback signal drifts further from the reference signal the frequency shift detection signal ("OUT2") provided by the second stage, e.g., comparison logic circuit 22 in FIG. 1, transitions to a high or asserted state when the feedback signal has drifted at least 2T ns apart from the reference signal. Next, the frequency shift detection signal ("OUT3") provided by a third stage transitions to a high or asserted state when the feedback signal has drifted at least 3T ns apart from the reference signal. Similarly, the frequency shift detection signals ("OUT4") provided by a fourth stage and fifth stage ("OUT5") transition in corresponding sequence to a high or asserted state when the feedback signal has drifted at least 4T ns and 5T ns, respectively, apart from the reference signal.

Figure 4:
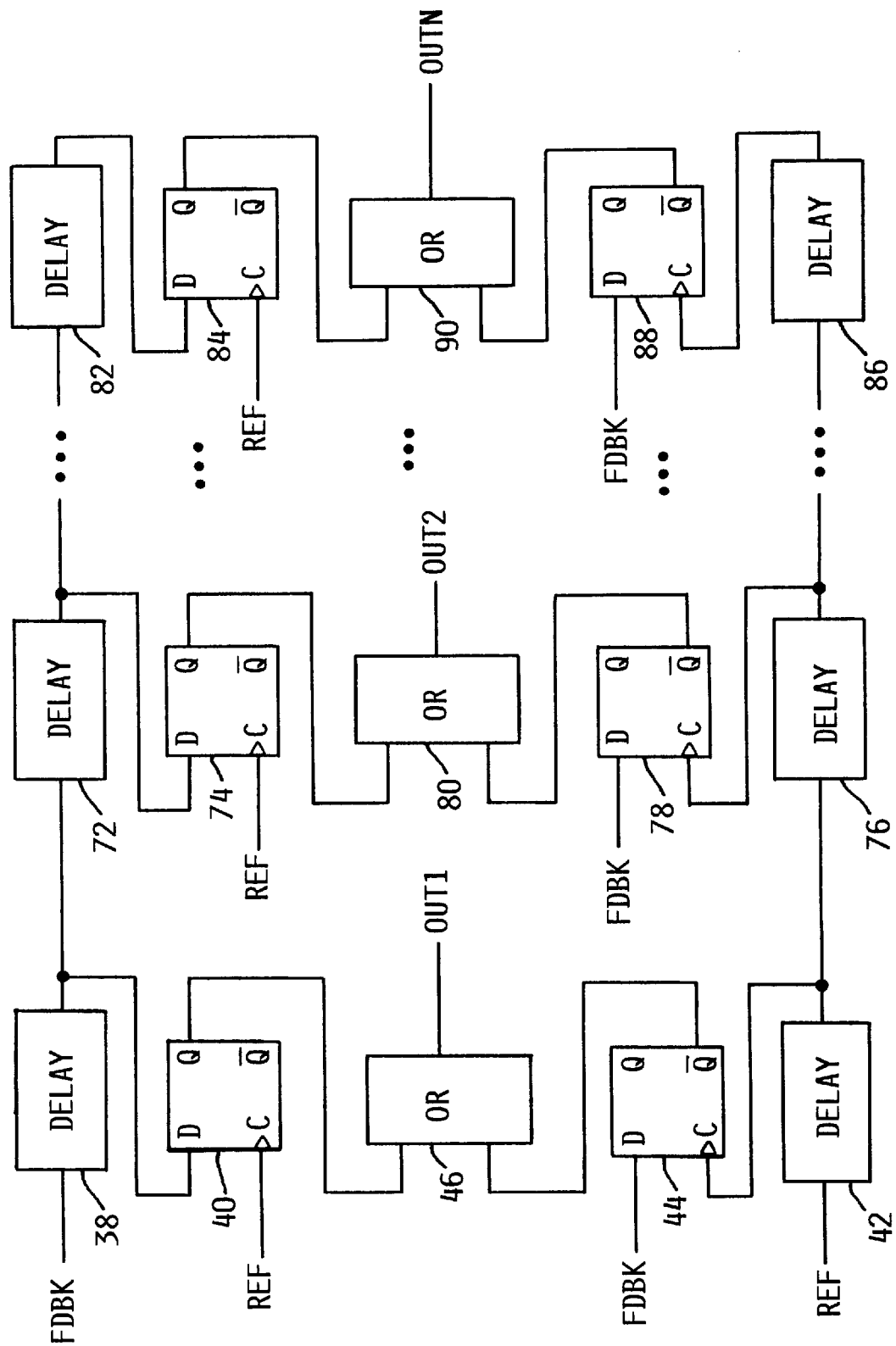
FIG. 4 is a block circuit diagram illustrating a frequency shift detection circuit of the present invention that detects positive and negative frequency shifts between the two signals.

As illustrated in FIG. 4, each stage of the circuit preferably detects a drift in the frequency of one or both of the reference signal and feedback signal such that the phase of the reference signal leads or is positive with respect to the phase of the feedback signal and detects a drift in the frequency of one or both of the reference signal and feedback signal such that the phase of the reference signal lags or is negative with respect to the phase of the feedback signal, and provides a frequency shift indication regardless of which is detected first.

A first stage includes a first delay line 38 with a delay of T ns, a first comparison logic circuit comprising a D-type flip-flop 40, a second delay line 42, and a second comparison logic circuit comprising a D-type flip-flop 44. An OR gate 46 that performs the logical "OR" function combines the outputs of the first and second comparison logic circuits of the first stage. The "D" input of flip-flop 40 is coupled to the output of delay line 38, and the clock input of flip-flop 40 receives the reference signal. The "D" input of flip-flop 44 receives the feedback signal, and the clock input of flip-flop 44 is coupled to the output of delay line 42. The inputs to OR gate 46 are coupled to the "Q" and "$\overline{Q}$" outputs, respectively, of flip-flops 40 and 44.

Figure 5:
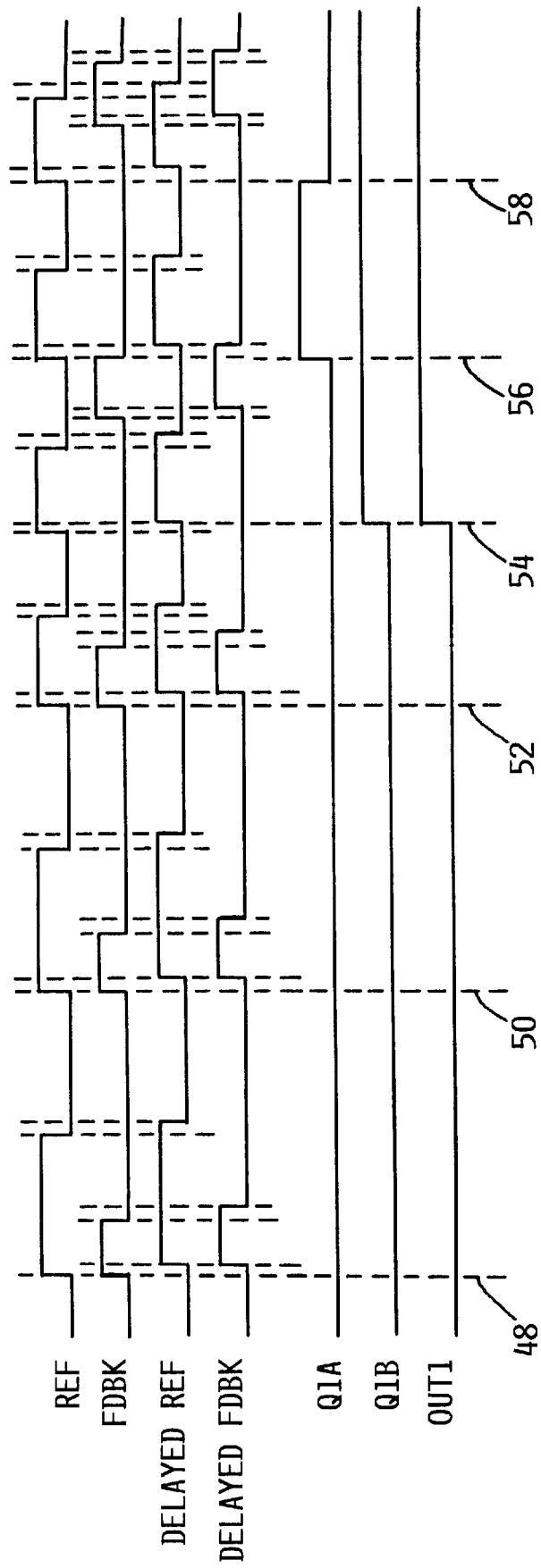
FIG. 5 is a timing diagram illustrating a reference signal increasing in frequency relative to a feedback signal.

FIG. 5 illustrates the operation of the first stage of the circuit when the feedback signal remains stable but the reference signal switches to a higher frequency. At time 48 the reference signal ("REF") transitions from low to high at the same time as the feedback signal ("FDBK"). Therefore, the clocking of flip-flop 40 by the rising edge of the reference signal latches the delayed feedback signal ("DELAYED FDBK") and causes the "Q" output ("Q1A") to be low. The clocking of flip-flop 44 by the rising edge of the delayed reference signal ("DELAYED REF") latches the feedback signal and causes its "$\overline{Q}$" output ("Q1B") to be low. Consequently, the output of the first stage ("OUT1"), which is the logical OR of Q1A and Q1B is low. The same conditions occur at times 50 and 52. At time 52, the frequency of the reference signal increases. Thus, at time 54, the clocking of flip-flop 44 by the rising edge of the delayed reference signal latches the feedback signal and causes its "$\overline{Q}$" output to go high. Consequently, the output of the first stage, which is the logical OR of Q1A and Q1B, goes high. At time 56, the clocking of flip-flop 40 by the rising edge of the reference signal latches the delayed feedback signal and causes the "Q" output to go high. The output of the first stage remains high. At time 58, when conditions cause the "Q" output of flip-flop 40 to go low again, the output of the first stage remains high because the "$\overline{Q}$" output of flip-flop 44 remains high.

Figure 6:
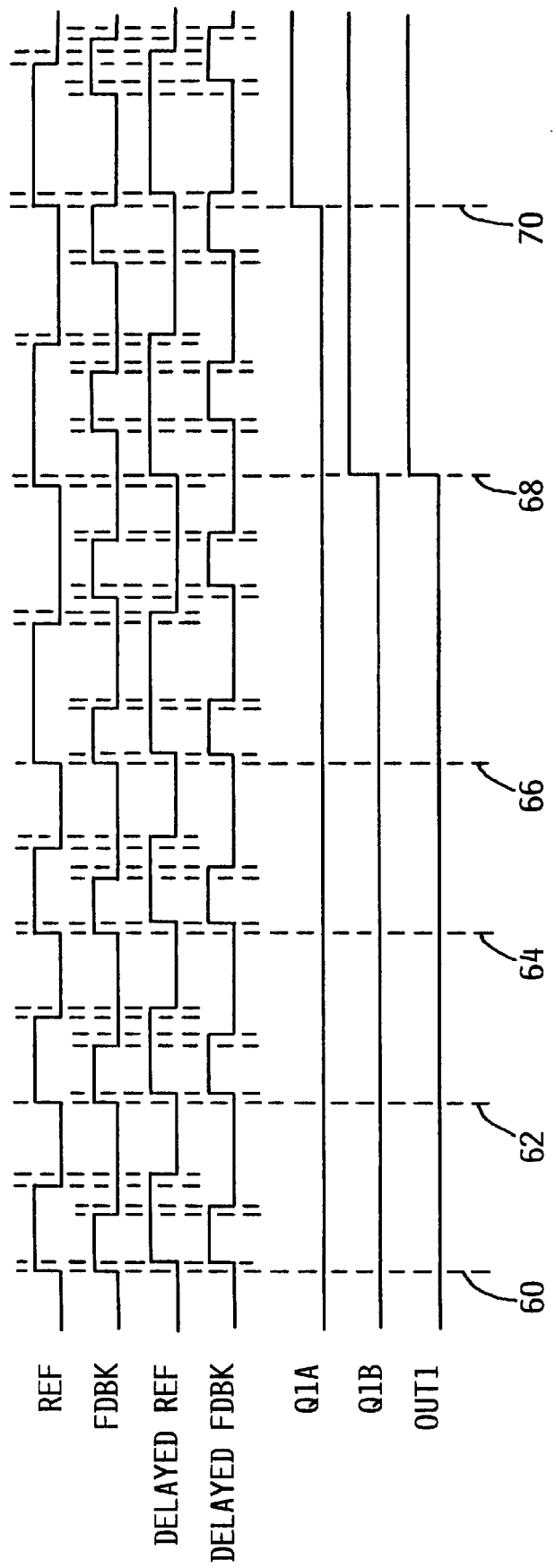
FIG. 6 is a timing diagram illustrating a reference signal decreasing in frequency relative to a feedback signal.

FIG. 6 illustrates the operation of the first stage of the circuit when the feedback signal remains stable but the reference signal switches to a lower frequency. At time 60 the reference signal ("REF") transitions from low to high at the same time as the feedback signal ("FDBK"). Therefore, the clocking of flip-flop 40 by the rising edge of the reference signal latches the delayed feedback signal ("DELAYED FDBK") and causes the "Q" output ("Q1A") to be low. The clocking of flip-flop 44 by the rising edge of the delayed reference signal ("DELAYED REF") latches the feedback signal and causes its "$\overline{Q}$" output ("Q1B") to be low. Consequently, the output of the first stage ("OUT1"), which is the logical OR of Q1A and Q1B is low. The same conditions occur at times 62, 64 and 66. At time 66, the frequency of the reference signal decreases. Thus, at time 68, the clocking of flip-flop 44 by the rising edge of the delayed reference signal latches the feedback signal and causes its 37 $\overline{Q}$" output to go high. Consequently, the output of the first stage, which is the logical OR of Q1A and Q1B, goes high. At time 70, the clocking of flip-flop 40 by the rising edge of the reference signal latches the delayed feedback signal and causes the "Q" output to go high. The output of the first stage remains high.

The other stages of the circuit operate in the same manner as described above with respect to the first stage. Therefore, their operation is not explicitly described herein. FIG. 4 further illustrates a second stage, an Nth stage, and, indicated by the ellipses (". . ."), any number of additional stages between the second and Nth stages.

The second stage includes a first delay line 72 with a delay of T ns, a first comparison logic circuit comprising a D-type flip-flop 74, a second delay line 76, and a second comparison logic circuit comprising a D-type flip-flop 78. An OR gate 80 combines the outputs of the first and second comparison logic circuits of the second stage. The "D" input of flip-flop 74 is coupled to the output of delay line 72, and the clock input of flip-flop 74 receives the reference signal. The "D" input of flip-flop 78 receives the feedback signal, and the clock input of flip-flop 78 is coupled to the output of delay line 76. The inputs to OR gate 80 are coupled to the "Q" and "$\overline{Q}$" outputs, respectively, of flip-flops 74 and 78.

The Nth stage of the circuit includes a first delay line 82 with a delay of T ns, a first comparison logic circuit comprising a D-type flip-flop 84, a second delay line 86, and a second comparison logic circuit comprising a D-type flip-flop 88. An OR gate 90 combines the outputs of the first and second comparison logic circuits of the second stage. The "D" input of flip-flop 84 is coupled to the output of delay line 82, and the clock input of flip-flop 84 receives the reference signal. The "D" input of flip-flop 88 receives the feedback signal, and the clock input of flip-flop 88 is coupled to the output of delay line 86. The inputs to OR gate 90 are coupled to the "Q" and "$\overline{Q}$" outputs, respectively, of flip-flops 84 and 88.

The invention may be used to detect an out-of-lock condition in a phase-locked loop or for any other suitable purpose. The selectable granularity feature allows a circuit designer to use the output of the stage that has a more useful sensitivity than the other stages for a given circuit design application. For example, a designer may be faced with the task of designing a circuit that tolerates a small amount of jitter or frequency deviation between two signals but that is to be disabled if the frequencies of the two signals deviate by more than a certain threshold amount. A conventional out-of-lock detector would not be suitable because its sensitivity is fixed, and may undesirably provide an out-of-lock indication in response to jitter that does not exceed the threshold amount Using a multi-stage circuit of the present invention, however, the designer can select the output of the stage that is sensitive only to frequency shifts greater than the threshold amount and connect that output to a disabling circuit, such as a gate for a master clock that inhibits the clock whenever the frequency shift detection signal is asserted on that output.

It will be evident that there are numerous embodiments of the present invention, which, while not specifically described above, are clearly within the scope and spirit of the invention. Consequently, the above description is considered to be exemplary only, and the full scope of the invention is to be determined solely by the appended claims.

What is claimed is:

1. A circuit for detecting a frequency shift between a first signal and a second signal, comprising:
    a plurality of delay circuits coupled to one another in series, said plurality of delay circuits receiving one of said first and second signals, each delay circuit producing a delayed signal; and
    a plurality of comparison logic circuits, each comparison logic circuit having an input receiving another of said first and second signals not received by said delay circuit and an input receiving one of said delayed signals and having an output providing a frequency shift detection signal in response to said comparison logic circuit detecting a phase difference between said one of said delayed signals and said another of said first and second signals.

2. The circuit recited in claim 1, wherein each comparison logic circuit comprises a storage element having an edge-triggered clock input and a data input.

3. The circuit recited in claim 1, wherein said storage element is a flip-flop.

4. The circuit recited in claim 3, wherein:
    each flip-flop is a D-type flip-flop having a D input and a clock input;
    said D input is coupled to said one of said first and second signals; and
    said clock input is coupled to one of said delayed signals.

5. The circuit recited in claim 3, wherein:
    each flip-flop is a D-type flip-flop having a D input and a clock input;
    said D input is coupled to one of said delayed signals; and
    said clock input is coupled to said one of said first and second signals.

6. The circuit recited in claim 1, wherein:
    said plurality of delay circuits comprises a plurality of first delay circuits and a plurality of second delay circuits, one said first delay circuit having an input receiving said first signal and having an output providing a delayed first signal in response to said first signal, and each other said first delay circuit having an input coupled to an output of another said first delay circuit for receiving another delayed first signal, one said second delay circuit having an input receiving said second signal and having an output providing a delayed second signal in response to said second signal, and each other said second delay circuit having an input coupled to an output of another said second delay circuit for receiving another delayed second signal; and
    said plurality of comparison logic circuits comprises a plurality of first comparison logic circuits and a plurality of second comparison logic circuits, each first comparison logic circuit having an input receiving said second signal and an input receiving one of said delayed first signals and having an output providing a first frequency shift detection signal in response to said first comparison logic circuit detecting a positive phase difference between said delayed first signal and said second signal, each second comparison logic circuit having an input receiving said first signal and an input receiving one of said delayed second signals and having an output providing a second frequency shift detection signal in response to said second comparison logic circuit detecting a negative phase difference between said delayed second signal and said first signal.

7. The circuit recited in claim 6, wherein:
    each first comparison logic circuit comprises a first D-type flip-flop having a D input and a clock input;
    each second comparison logic circuit comprises a second D-type flip-flop having a D input and a clock input;
    said D input of said first D-type flip-flop is coupled to said one of said delayed first signals, and said clock input of said first D-type flip-flop is coupled to said second signal;
    said D input of said second D-type flip-flop is coupled to said first signal, and said clock input of said first D-type flip-flop is coupled to one of said delayed second signals.

8. The circuit recited in claim 7, further comprising a plurality of OR elements, each OR element having a first input receiving a first frequency shift detection signal and a second input receiving a corresponding second frequency shift detection signal.

9. A method for detecting a frequency shift between a first signal and a second signal, comprising the steps of:
    producing a plurality of delayed signals in response to one of said first and second signals, each delayed signal delayed with respect to said one of said first and second signals by a different amount; and
    comparing another of said first and second signals not received by said delay circuit to one of said delayed signals to detect a phase difference between said one of said delayed signals and said another of said first and second signals; and
    providing a frequency shift detection signal in response to said detection of a phase difference.

10. The method recited in claim 9, wherein said comparing step comprises the step of providing said one of said delayed signals and said another of said first and second signals to a storage element having an edge-triggered clock input and a data input.

11. The method recited in claim 10, wherein said step of providing said one of said delayed signals and said another of said first and second signals to a storage element comprises the step of providing said one of said delayed signals and said another of said first and second signals to a flip-flop.

12. The circuit recited in claim 11, wherein said step of providing said one of said delayed signals and said another of said first and second signals to a flip-flop comprises the steps of:

providing said one of said first and second signals to a D input of a D-type flip-flop; and providing one of said delayed signals to a clock input of said D-type flip-flop.

13. The method recited in claim 11, wherein said step of providing said one of said delayed signals and said another of said first and second signals to a flip-flop comprises the steps of:

providing said one of said first and second signals to a clock input of a D-type flip-flop; and providing one of said delayed signals to a D input of said D-type flip-flop.

14. The method recited in claim 10, wherein:

said step of producing a plurality of delayed signals comprises the steps of providing said first signal to a plurality of first delay circuits and providing said second signal to a plurality of second delay circuits, each first delay circuit producing a delayed first signal delayed with respect to said first signal, each second delay circuit producing a delayed second signal delayed with respect to said second signal, each delayed first signal delayed by a different amount from said first signal from all other first delayed first signals and delayed by the same amount as a corresponding second delay signal is delayed from said second signal; and said step of comparing another of said first and second signals not received by said delay circuit to one of said delayed signals comprises the steps of comparing said second signal to one of said delayed first signals to detect a positive phase difference and comparing said first signal to one of said delayed second signals to detect a negative phase difference.

15. The method recited in claim 14, wherein:

said step of comparing said second signal to one of said delayed first signals to detect a positive phase difference comprises the steps of providing said one of said delayed first signals to a D input of a first D-type flip-flop, and providing said second signal to a clock input of said first D-type flip-flop, said first D-type flip-flop producing a first frequency shift detection signal; and providing said first signal to a D input of a second D-type flip-flop, and providing said one of said delayed second signals to a clock input of said second D-type flip-flop, said second D-type flip-flop producing a second frequency shift detection signal.

16. The method recited in claim 15, further comprising the step of providing said first and second first frequency shift detection signals to inputs of an OR element.

17. A method for determining the direction of a relative frequency change between a frequency of a first signal and a frequency of a second signal, comprising the steps of:

producing a delayed first signal by providing said first signal to a first delay circuit;

producing a delayed second signal by providing said second signal to a second delay circuit, said delayed first signal delayed from said first signal and said delayed second signal delayed from said second signal by equal amounts;

comparing said second signal to said delayed first signal to detect a positive phase difference; and comparing said first signal to said delayed second signal to detect a negative phase difference.

\* \* \* \* \*